US012726016B2

(12) United States Patent
Weon

(10) Patent No.: US 12,726,016 B2
(45) Date of Patent: Sep. 1, 2026

(54) BATTERY PACK CONTROL APPARATUS AND METHOD FOR FIXING FAILURE OF RELAY

(71) Applicant: SAMSUNG SDI CO., LTD., Yongin-si (KR)

(72) Inventor: Jong Hyun Weon, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 218 days.

(21) Appl. No.: 18/624,996

(22) Filed: Apr. 2, 2024

(65) Prior Publication Data

US 2025/0158388 A1 May 15, 2025

(30) Foreign Application Priority Data

Nov. 10, 2023 (KR) ........................ 10-2023-0155177

(51) Int. Cl.
*H02H 7/18* (2006.01)
*G01R 31/327* (2006.01)
(Continued)

(52) U.S. Cl.
CPC ........... *H02H 7/18* (2013.01); *G01R 31/3278* (2013.01); *H01M 10/425* (2013.01);
(Continued)

(58) Field of Classification Search
CPC .... H02H 7/18; H02H 1/0007; G01R 31/3278; G01R 31/3275; G01R 19/145;
(Continued)

(56) References Cited

U.S. PATENT DOCUMENTS

2002/0070608 A1* 6/2002 Matsuki ................. B23K 31/02 324/420
2013/0093427 A1* 4/2013 Bemrich ................. B60L 50/61 324/418

(Continued)

FOREIGN PATENT DOCUMENTS

CN 102175971 B 10/2013
CN 108466552 A 8/2018

(Continued)

OTHER PUBLICATIONS

Extended European Search Report issued in corresponding EP Application No. 24188606.8, dated, Jan. 8, 2025, 10 pages.

*Primary Examiner* — Sreeya Sreevatsa
(74) *Attorney, Agent, or Firm* — Womble Bond Dickinson (US) LLP

(57) ABSTRACT

A battery pack control apparatus for fixing a failure of a relay includes a battery module including a plurality of battery cells, the relay that is configured to selectively conduct or block an output current of the battery module, a current sensor configured to detect the output current of the battery module, a voltage sensor configured to measure voltages at both ends of the relay, and a processor configured to control the relay and to detect a state of the relay based on at least one of the current detected by the current sensor or the voltages measured by the voltage sensor, and in response to determining that the relay malfunctions, to check and fix the relay.

18 Claims, 9 Drawing Sheets

(51) Int. Cl.
*H01M 10/42* (2006.01)
*H02H 1/00* (2006.01)
*H02J 7/80* (2026.01)

(52) U.S. Cl.
CPC ............. *H02H 1/0007* (2013.01); *H02J 7/80* (2026.01); *H01M 2010/4271* (2013.01)

(58) Field of Classification Search
CPC ............ G01R 31/3274; H01M 10/425; H01M 2010/4271; H01M 10/48; H02J 7/0047; Y02E 60/10
USPC ............................................................ 361/78
See application file for complete search history.

(56) References Cited

U.S. PATENT DOCUMENTS

2016/0295652 A1* 10/2016 Zotter .................... H05B 45/37
2018/0238968 A1* 8/2018 Wada ................. G01R 31/3275
2023/0305059 A1* 9/2023 Yamane ............. G01R 31/3275

FOREIGN PATENT DOCUMENTS

CN 109884519 A 6/2019
CN 116653621 A 8/2023
CN 116819295 A 9/2023
KR 10-2022-0042963 A 4/2022

* cited by examiner 251
280
241-3
VOLTAGE SENSOR
241-5
VOLTAGE SENSOR
242-1
CURRENT SENSOR
242-2
CURRENT SENSOR
241-4
VOLTAGE SENSOR
253
252
210
PROCESSOR
241-1
VOLTAGE SENSOR
241-2
VOLTAGE SENSOR
290

BATTERY PACK CONTROL APPARATUS AND METHOD FOR FIXING FAILURE OF RELAY

CROSS-REFERENCE TO RELATED APPLICATION

This application claims priority to and the benefit of Korean Patent Application No. 10-2023-0155177, filed on Nov. 10, 2023, the disclosure of which is incorporated herein by reference in its entirety.

BACKGROUND

1. Field

Aspects of the present invention relate to a battery pack control apparatus and a method for detecting a temporary malfunction of a relay included in a battery pack and fixing a failure of the relay.

2. Description of the Related Art

A secondary battery is a battery that can be charged and discharged, unlike a primary battery that cannot be recharged. Low-capacity secondary batteries are used in small portable electronic devices such as smartphones, feature phones, notebook computers, digital cameras, and camcorders, and high-capacity secondary batteries are widely used as driving power sources and power storage batteries for motors in hybrid and electric vehicles. Such a secondary battery includes an electrode assembly provided with a positive electrode and a negative electrode, a case for accommodating the electrode assembly, electrode terminals connected to the electrode assembly, and the like.

The secondary battery is charged by an external charging current and outputs a discharge current to supply the current to a load.

The secondary battery may include a relay for controlling energy to be transmitted to a line through which the energy is transmitted to a vehicle or the like.

The relay is opened or closed according to a control command.

In a state in which an open command is received, when the relay is not opened and remains in a closed state, the energy of the secondary battery is not blocked and is transmitted to an apparatus such as a vehicle, and thus an accident can occur.

Accordingly, a battery pack measures voltages at both ends of the relay or a measure a current flowing through the relay to check an operation state of the relay and detect a failure of the relay.

When the relay is not opened even when the open command is received, it is determined that the relay has a failure, and it is determined that the corresponding relay has a permanent failure, the battery pack in a vehicle or apparatus, in which a battery is mounted, needs to be replaced.

In some cases, the relay may temporarily malfunction due to a specific cause and then return to normal operation, when it is determined that the battery pack has the permanent failure, the corresponding battery pack cannot be reused.

Accordingly, a method of distinguishing between a temporary malfunction and a permanent failure in relation to a failure of a relay is required.

The above-described information described in the background technology of this invention is only to facilitate understanding of the background of the present invention and may also have information not included in the conventional technology.

SUMMARY

Aspects of embodiments of the present invention are directed to a battery pack control apparatus and a method for fixing a temporary failure of a relay after rechecking the relay even when a failure of the relay is detected.

However, technical objectives to be solved by the present invention are not limited to the above-described objective, and other objectives which are not described above will be clearly understood by those skilled in the art through the following description.

According to some embodiments of the present invention, there is provided a battery pack control apparatus for fixing a failure of a relay, the battery pack control apparatus including: a battery module including a plurality of battery cells; relay that is configured to selectively conduct or block an output current of the battery module; a current sensor configured to detect the output current of the battery module; a voltage sensor configured to measure voltages at both ends of the relay; and a processor configured to control the relay and to detect a state of the relay based on at least one of the current detected by the current sensor or the voltages measured by the voltage sensor, and in response to determining that the relay malfunctions, to check and fix the relay.

In some embodiments, in response to detecting that the relay is in a closed state, the processor is configured to determine that the relay malfunctions and to perform checking and fixing of the relay a number of times.

In some embodiments, the processor is configured to determine whether the relay is in an open state based on any one of the current and the voltages.

In some embodiments, the processor is configured to check a state of the relay based on the voltages in response to a connected device being in an operational state, and to check a state of the relay based on the current in response to the connected device being in a stopped state.

In some embodiments, the processor is configured to check a state of the relay based on the current, and in response to determining that the relay is in an open state, the processor is configured to recheck a state of the relay based on the voltages.

In some embodiments, the processor is configured to determine a state of the relay based on the current, and in response to determining that the relay is in a closed state, the processor is configured to determine that the relay has a failure.

In some embodiments, the processor is configured to check a state of the relay based on the voltages, and in response to determining that the relay is in an open state, the processor is configured to determine that the relay operates normally.

In some embodiments, the processor is configured to check a state of the relay based on the voltage, and in response to determining that the relay is not in an open state, the processor is configured to fix the relay.

In some embodiments, the processor is configured to fix the relay by repeatedly turning on and off an operating voltage of the relay a number of times.

In some embodiments, the processor is configured to fix the relay first in response to determining that the relay is in a closed state, and to finally check the relay.

In some embodiments, the processor is configured to finally check the relay, and in response to determining that the relay is in a closed state, the processor is configured to finally determine that the relay has a permanent failure.

According to some embodiments of the present invention, there is provided a battery pack control method for fixing a failure of a relay, the method including: controlling, by a processor, a relay configured to be opened in response to a state or request signal of a battery module; detecting, by the processor, a state of the relay based on at least one of a current and a voltage; checking and fixing, by the processor, the relay in response to determining that the relay malfunctions; stopping, by the processor, the checking and fixing in response to determining that the relay operates normally while the checking and fixing of the relay are performed; and determining, by the processor, that the relay has a permanent failure in response to determining that the relay has a failure.

In some embodiments, the detecting of the state of the relay includes: detecting, by a current sensor, an output current of the battery module while a connected device operates; determining that the relay malfunctions in response to the relay being in a closed state according to the output current; determining that the relay operates normally in response to the relay being in an open state according to the output current; and determining that the relay has the failure in response to the relay malfunctioning.

In some embodiments, the detecting of the state of the relay includes: determining, by the processor, that the relay is in the closed state in response to the current being non-zero; and determining, by the processor, that the relay is in an open state in response to the current being zero.

In some embodiments, the detecting of the state of the relay includes: measuring, by a voltage sensor, voltages at both ends of the relay in response to a connected device being stopped; comparing the voltages at both ends of the relay; determining that the relay malfunctions in response to the relay being in a closed state according to the voltages at both ends of the relay; and determining that the relay operates normally in response to the relay being in an open state according to the voltages at both ends of the relay.

In some embodiments, the detecting of the state of the relay includes: determining, by the processor, that the relay is in the closed state in response to the voltages at both ends of the relay being the same; and determining, by the processor, that the relay is in the open state in response to the voltages at both ends of the relay being different.

In some embodiments, the checking and fixing of the relay includes: checking the state of the relay in response to the voltages; and fixing the relay according to a checking result.

In some embodiments, the checking and fixing of the relay includes: rechecking a state of the relay in response to the voltages in response to determining that the relay is normal based on the current; and fixing the relay according to a rechecking result.

In some embodiments, the checking and fixing of the relay includes fixing, by the processor, the relay by repeatedly turning on and off an operating voltage of the relay a number of times.

In some embodiments, the checking and fixing of the relay further includes: checking and fixing the relay a number of times; fixing the relay first when it is determined that the relay is in a closed state; and checking the relay.

BRIEF DESCRIPTION OF THE DRAWINGS

The following drawings attached to this specification illustrate embodiments of the present disclosure, and further describe aspects and features of the present disclosure together with the detailed description of the present disclosure. Thus, the present disclosure should not be construed as being limited to the drawings.

DETAILED DESCRIPTION

Figure 1A:
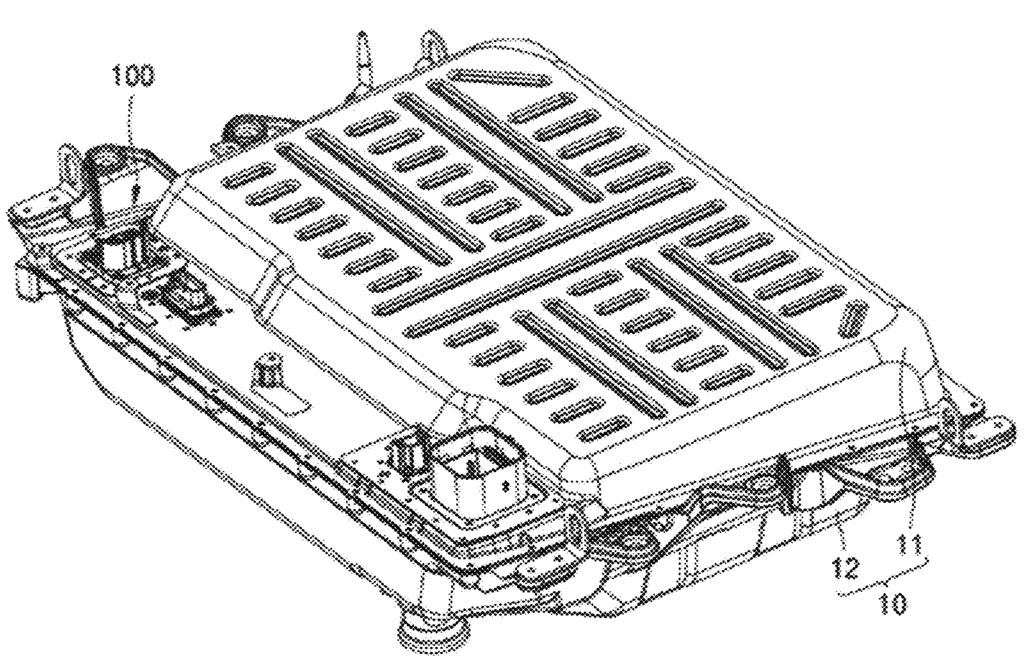
FIGS. 1A and 1B are views illustrating an example of a battery pack according to some embodiments of the present invention.

Hereinafter, embodiments of the present disclosure will be described, in detail, with reference to the accompanying drawings. The terms or words used in this specification and claims should not be construed as being limited to the usual or dictionary meaning and should be interpreted as meaning and concept consistent with the technical idea of the present disclosure based on the principle that the inventor can be his/her own lexicographer to appropriately define the concept of the term to explain his/her invention in the best way.

The embodiments described in this specification and the configurations shown in the drawings are only some of the embodiments of the present disclosure and do not represent all of the technical ideas, aspects, and features of the present disclosure. Accordingly, it should be understood that there may be various equivalents and modifications that can replace or modify the embodiments described herein at the time of filing this application.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. When phrases such as "at least one of" A, B and C, "at least one of A, B or C," "at least one selected from a group of A, B and C," or "at least one selected from among A, B and C" are used to designate a list of elements A, B and C, the phrase may refer to any and all suitable combinations or a subset of A, B and C, such as A, B, C, A and B, A and C, B and C, or A and B and C. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112 (a) and 35 U.S.C. § 132 (a).

References to two compared elements, features, etc. as being "the same" may mean that they are "substantially the same". Thus, the phrase "substantially the same" may include a case having a deviation that is considered low in the art, for example, a deviation of 5% or less. In addition, when a certain parameter is referred to as being uniform in a given region, it may mean that it is uniform in terms of an average.

Throughout the specification, unless otherwise stated, each element may be singular or plural.

When an arbitrary element is referred to as being disposed (or located or positioned) on the "above (or below)" or "on (or under)" a component, it may mean that the arbitrary element is placed in contact with the upper (or lower) surface of the component and may also mean that another component may be interposed between the component and any arbitrary element disposed (or located or positioned) on (or under) the component.

In addition, it will be understood that when an element is referred to as being "coupled," "linked" or "connected" to another element, the elements may be directly "coupled," "linked" or "connected" to each other, or an intervening element may be present therebetween, through which the element may be "coupled," "linked" or "connected" to another element. In addition, when a part is referred to as being "electrically coupled" to another part, the part can be directly connected to another part or an intervening part may be present therebetween such that the part and another part are indirectly connected to each other.

Throughout the specification, when "A and/or B" is stated, it means A, B or A and B, unless otherwise stated. That is, "and/or" includes any or all combinations of a plurality of items enumerated. When "C to D" is stated, it means C or more and D or less, unless otherwise specified.

Figure 1B:
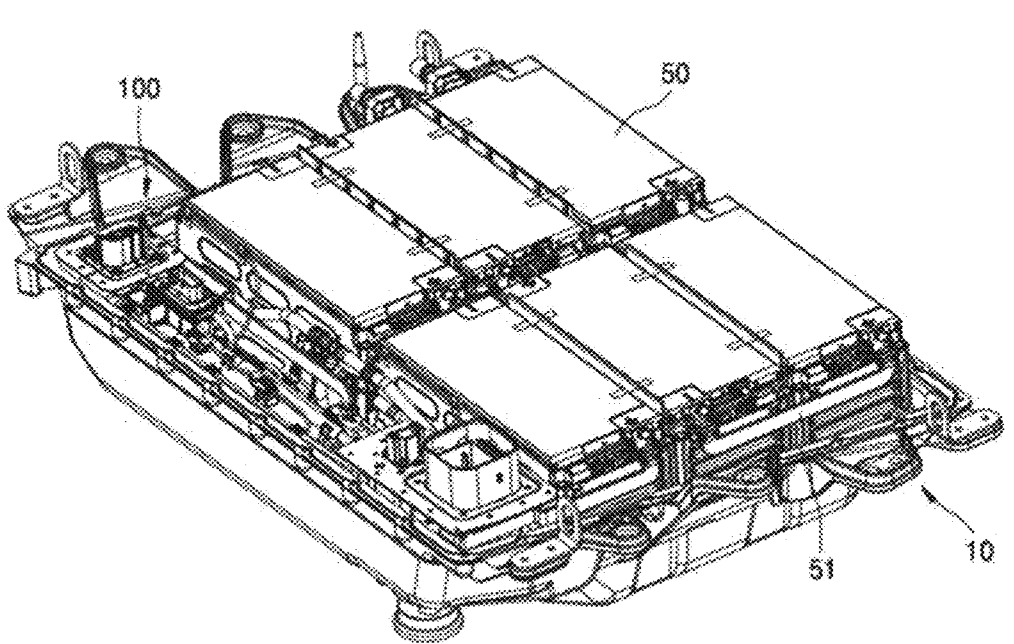

FIGS. 1A and 1B are views illustrating an example of a battery pack according to some embodiments of the present invention.

In FIGS. 1A and 1B, a battery pack 100 may include a plurality of battery modules 50 and a housing 10 for accommodating the plurality of battery modules 50. For example, the housing 10 may include first and second housings 11 and 12 which are coupled in facing directions with the plurality of battery modules 50 interposed therebetween. The plurality of battery modules 50 may be electrically connected to each other using a busbar 51, and the plurality of battery modules 50 may be electrically connected in series, parallel, or a series-parallel mixed manner to obtain a required electric output.

The battery pack 100 includes one or more battery modules and a pack housing with an accommodation space for accommodating the one or more battery modules 50.

Each of the battery modules 50 may include a plurality of battery cells and a module housing. The stack-type battery cells may be accommodated in the module housing. Each of the battery cells may include a positive lead and a negative lead. The battery cell may be a circular type, an angular type, or a pouch type, which may be used according to a type of a battery.

In the battery pack 100, one cell stack may constitute one module. The cell stack may be accommodated in the accommodation space of the pack housing or in an accommodation space partitioned by a frame or partition.

The battery cell generates a large amount of heat during charging/discharging. The generated heat is accumulated in the battery cell and accelerates the degradation of the battery cell. Accordingly, the battery pack 100 further includes a cooling member to suppress or reduce the degradation of the battery cell. The cooling member may be provided in a lower portion of the accommodation space in which the battery cell is provided, but is not limited thereto and may be provided in an upper portion or side portion thereof according to the battery pack 100.

Exhaust gas generated inside the battery cell under abnormal operation conditions known as a thermal runaway or thermal event may be discharged to the outside of the battery cell. The battery pack or the battery module may include an exhaust port and the like for discharging the exhaust gas in order to prevent or substantially reduce damage to the battery pack or the module by the exhaust gas.

The battery pack 100 may include a battery module (also referred to as a battery) and a battery management system (BMS) for managing the battery. The BMS may include a detecting unit, a balancing unit, and a control unit. The battery module may include a plurality of cells connected in series or in parallel, or a combination thereof. The battery modules may be connected in series or in parallel.

Figure 2:
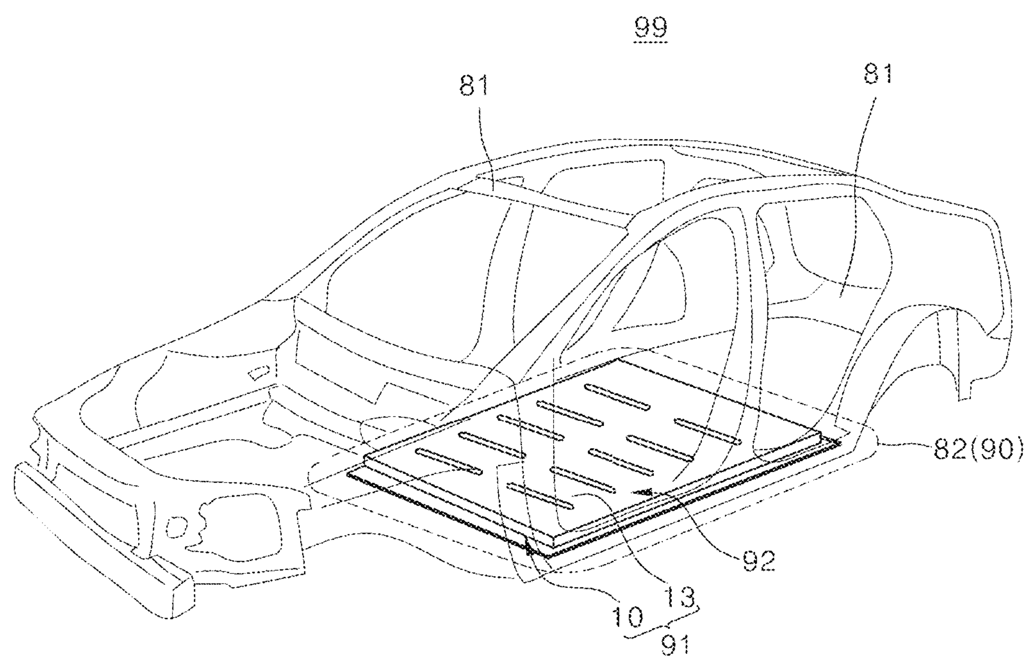
FIG. 2 is a view illustrating an example in which a battery pack according to some embodiments of the present invention is installed on a vehicle body.

FIG. 2 is a view illustrating an example in which a battery pack according to some embodiments of the present invention is installed on a vehicle body.

In FIG. 2, a battery pack 91 may include a battery pack cover 13, which is a part of a vehicle underbody 92 and a pack frame 10 disposed under the vehicle underbody 92. The pack frame 10 and the battery pack cover 13 may have a structure integrally formed with a vehicle bottom portion 82.

The vehicle underbody 92 may distinguish the inside and the outside of a vehicle 99, and the carrier frame 10 may be disposed at the outside of the vehicle 99.

Figure 3:
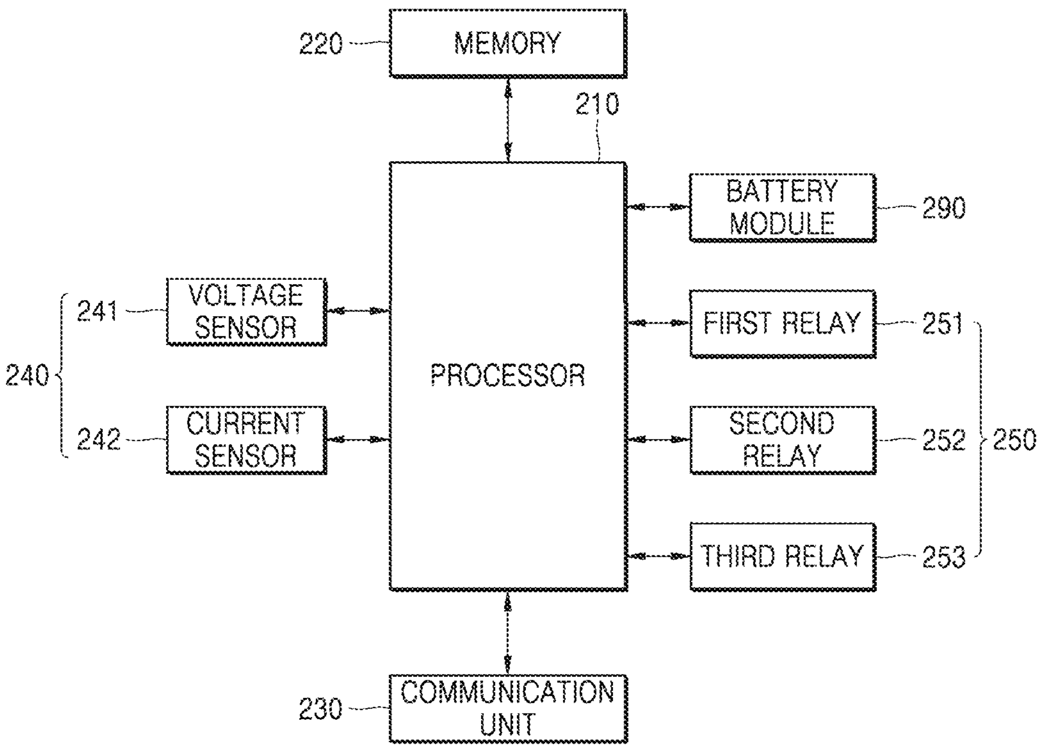
FIG. 3 is a schematic block diagram of a battery pack control apparatus which fixes a failure of a relay according to some embodiments of the present invention.
Figure 4:
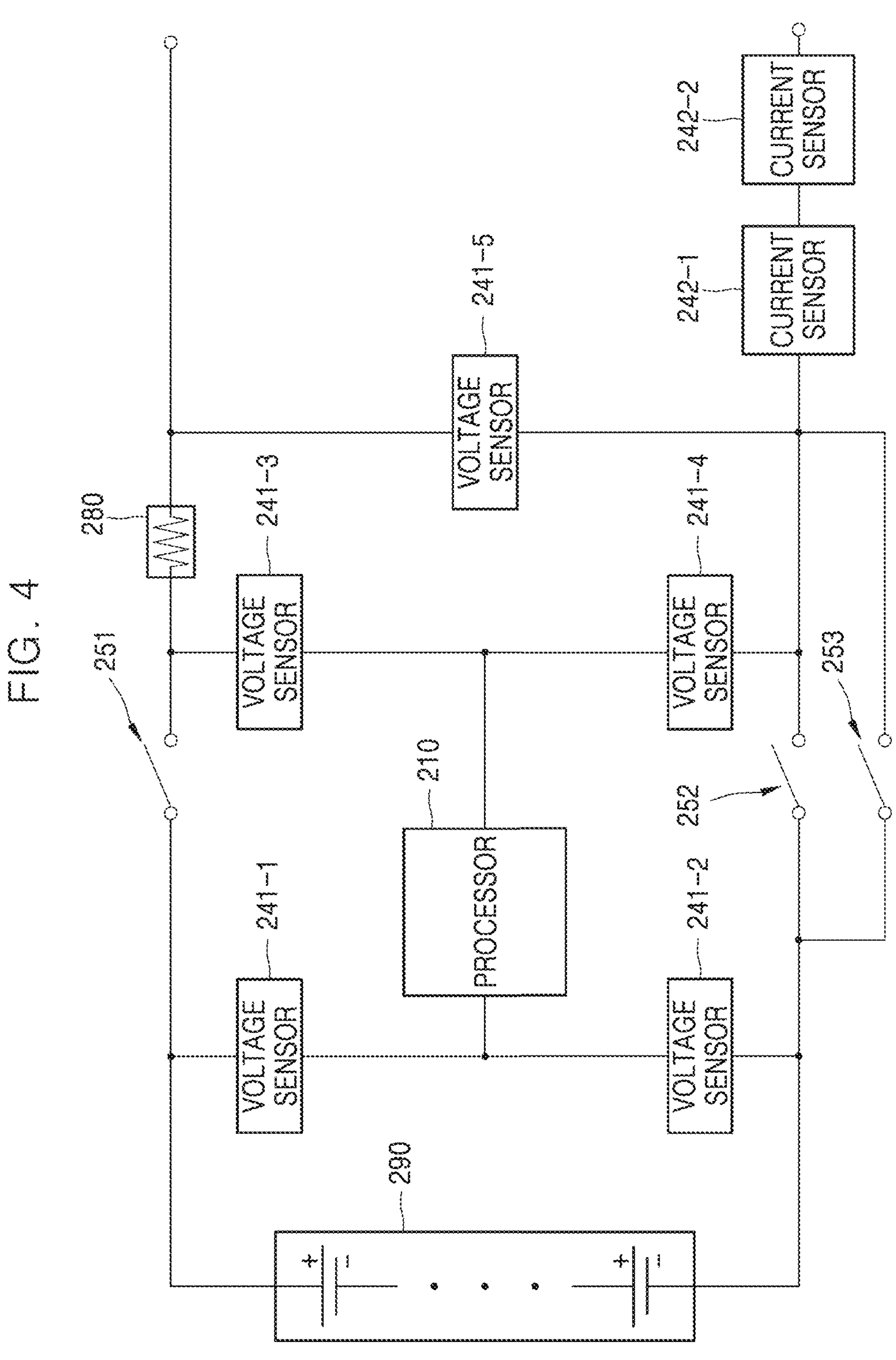
FIG. 4 is a view illustrating a connection configuration of a battery cell and the relay of the battery pack control apparatus according to some embodiments of the present invention.

FIG. 3 is a schematic block diagram of a battery pack control apparatus which fixes a failure of a relay according to some embodiments of the present invention. FIG. 4 is a view illustrating a connection configuration of the battery cell and the relay of the battery pack control apparatus according to some embodiments of the present invention.

Referring to FIG. 3, a battery pack control apparatus 200 according to some embodiments of the present invention may include a memory 220, a communication unit 230, a sensor 240, a relay 250, a battery module 290, and a processor 210.

The sensor 240 may include a voltage sensor 241 and a current sensor 242. In addition, the sensor 240 may further include a temperature sensor for measuring a temperature of the battery module 290.

The sensor 240 transmits measured data to the processor 210.

The voltage sensor 241 measures a voltage of the battery module 290. The voltage sensor 241 may be provided as a plurality of voltage sensors 241 to measure a voltage of each battery cell of the battery module.

In addition, the voltage sensors 241 may be connected to both ends of the relay 250 to measure voltages at (e.g., applied to) both ends of the relay 250.

The current sensor 242 may be provided as a plurality of current sensors 242 to measure a current of each battery cell. In addition, the current sensor 242 may be connected to an output terminal of the battery pack to measure a current output from the battery module 290 to the vehicle.

The memory 220 may store current data and voltage data received from the sensor 240, set data for processing, data about the battery module 290, data for determining a state of the battery module 290, state of charge (SOC) data of the battery module 290 or battery cells 291 to 299, and data generated during an operation process of the processor 210.

In addition, the memory 220 may store data for detecting a failure of the relay 250, data for checking the relay 250, and data for fixing the failure of the relay 250.

The memory 220 may store data about at least one of a data processing algorithm, a relay failure diagnosis algorithm, a relay check algorithm, and a relay fixing algorithm.

The memory 220 may include a storage medium such as a random-access memory (RAM), a non-volatile memory such as a read-only memory (ROM), an electrically erased programmable ROM (EEPROM), a flash memory, and/or the like.

The communication unit 230 transmits and receives data to and from the processor 210, the memory 220, the battery module 290, the sensor 240, and the relay 250. In addition, the communication unit 230 may transmit and receive data to and from main processors of an apparatus or a device including the processor 210 and the battery pack control apparatus 200.

For example, the communication unit 230 may include a controller area network (CAN) or local interconnect network (LIN) communication driver to transmit and receive data. The communication unit 230 may transmit and receive data through a serial or parallel communication.

The relay 250 may be utilized to block an output of the battery module 290 or an external current supplied to the battery module 290 when a failure occurs in the battery module 290 or an apparatus such as the vehicle.

The relay 250 may be turned on or off in response to a control command from the processor 210. The relay 250 may include a mechanical contactor that is turned on or off by a magnetic force of a coil. In some examples, the relay 250 may include a semiconductor switch such as a metal oxide semiconductor field effect transistor (MOSFET).

Referring to FIGS. 3 and 4, the relay 250 may include a first relay 251, a second relay 252, and a third relay 253.

The first relay 251 may be connected to one end of the battery module 290 and an input terminal of the battery pack to transmit or block (e.g., not transmit) an input current (e.g., charge current) to the battery module 290.

The second relay 252 may be connected to the other end of the battery module 290 and the output terminal of the battery pack to output or block (e.g., not output) an output current (e.g., discharge current) of the battery module 290 to an apparatus such as a vehicle.

The third relay 253 is a pre-charge relay connected in parallel to the second relay 252.

The battery module 290 may include a plurality of battery cells. The plurality of battery cells may be connected in series or in parallel.

The processor 210 may monitor a state of the plurality of battery modules 290, determine an SOC, and calculate a state of health (SOH). The processor 210 may control charging and discharging of the battery module 290, control a temperature of the battery module 290, and perform a balancing control. The processor 210 may detect a failure of the battery module 290. In addition, the processor 210 may perform at least one protection function among over-discharge, over-charge, over-current prevention, short circuit, and fire extinguishing functions on the basis of a state monitoring result.

Any one of a battery management system (BMS), a battery pack control module (BPCM), a central processing control unit (CPU), an electronic control unit (ECU), and a micro controller unit (MCU) may be used as the processor 210.

The processor 210 controls the relay 250 according to a state of the battery module 290 and a signal transmitted from the vehicle.

The processor 210 may detect a failure of the relay 250 based on data input from the voltage sensor 241 and the current sensor 242, check a state of the relay 250, and fix the failure of the relay 250.

The processor 210 may transmit a control signal to the relay 250 to open the relay 250 and determine a state of the relay 250 according to an amount of current measured by the current sensor 242.

In addition, the processor 210 may control the relay 250 to open the relay 250 and determine a state of the relay 250 according to magnitudes of voltages at both ends of the relay 250 measured by the voltage sensor 241.

For example, when a current is detected after an open command is transmitted to the relay 250, the processor 210 may determine that the relay 250 is not opened. In addition, when magnitudes of voltages at both end of the relay 250 are the same or substantially the same, the processor 210 may determine that the relay 250 is not opened.

When the relay 250 does not operate according to a control command as described above, the processor 210 determines that a failure has occurred, checks the relay 250, and finally determines a state of the relay 250.

As the processor 210 checks the relay 250, when it is determined that the relay 250 is operating normally, the processor 210 may stop checking and determine that the relay 250 is normal.

When it is determined that the relay 250 has a failure even after the relay 250 is checked, the processor 210 performs fixing operations on the relay 250.

The processor 210 may check and fix the relay 250 a number of times (e.g., a predetermined number of times) and then finally determine a state of the relay 250.

When it is determined that the relay 250 has a failure according to a final determination result, the processor 210 may transmit a signal for a relay failure through the communication unit 230.

The processor 210 may determine whether each of the first relay 251 to the third relay 253 has a failure and check and fix each of the first relay 251 to the third relay 253.

In some embodiments, the battery pack control apparatus 200 includes the processor 210 connected to the battery module 290 to check and manage a state of the battery module 290, the voltage sensor 241, the current sensor 242, and a plurality of relays 250.

The processor 210 may control the relay 250 according to a signal received from the vehicle or apparatus on which the battery pack is mounted through the communication unit 230. In addition, the processor 210 may control the relay 250 according to a state of the battery module 290.

The processor 210 controls the relay 250 to open the relay 250 when an output of the battery module 290 is blocked or an output blocking request is received.

The processor 210 transmits a control command to open the first relay 251 to the third relay 253 and checks a state of the relay 250 on the basis of data measured by the sensor 240.

The processor 210 may check a state of the relay 250 using a relay current or voltage according to an operating state of a load, that is, the vehicle or apparatus, connected to the battery pack.

For example, while the vehicle operates, when the relay 250 is controlled to be opened, a state of the relay may be checked using a voltage.

Even when a state of the relay 250 is checked using a current, because some of the plurality of relays may malfunction, the processor 210 may recheck the state of the relay 250 through voltages at both ends of the relay 250.

One end of a first voltage sensor 241-1 is connected to the first relay 251 and a positive terminal (+) of the battery module 290 to measure a voltage at one end of the first relay 251 and transmit the measured voltage to the processor 210.

A second voltage sensor 241-2 is connected to a negative terminal (+) of the battery module 290 and one end of the second relay 252, measures a voltage applied to one end of the second relay 252, and transmits the measured voltage to the processor 210.

A third voltage sensor 241-3 is connected to the other end of the first relay 251, measures a voltage at one end of the first relay 251, and transmits the measured voltage to the processor 210.

A fourth voltage sensor 241-4 is connected to the other end of the second relay 252, measures a voltage at one end of the second relay 252, and transmits the measured voltage to the processor 210.

A fifth voltage sensor 241-5 may be connected to a fuse 280, the second relay 252, and the third relay 253 and may measure a voltage between the input terminal and the output terminal of the battery pack. In addition, the fifth voltage sensor 241-5 may measure a voltage at any one end of the third relay 253.

A first current sensor 242-1 and a second current sensor 242-2 are connected to the second relay 252 and the third relay 253 and detect an output current (e.g., discharge current) of the battery module 290.

The processor 210 receives voltages at both ends of the first relay 251 to the third relay 253 through the first voltage sensor 241-1 to the fifth voltage sensor 241-5 to determine states thereof.

When voltages at both ends of the relay 250 are the same or substantially the same, the processor 210 may determine that the relay 250 is in a closed state, and when voltages at both ends are different (e.g., are off by more than 5%), the processor 210 may determine that the relay 250 is in an open state.

When an output current measured by the current sensor 242 is zero, the processor 210 may determine that the relay 250 is in the open state. However, because an output current is zero even when the first relay 251 is opened according to a control command, and the second relay 252 is in the closed state due to a malfunction, the processor 210 may recheck a state of the relay 250 using the voltage sensor 241.

Figure 5:
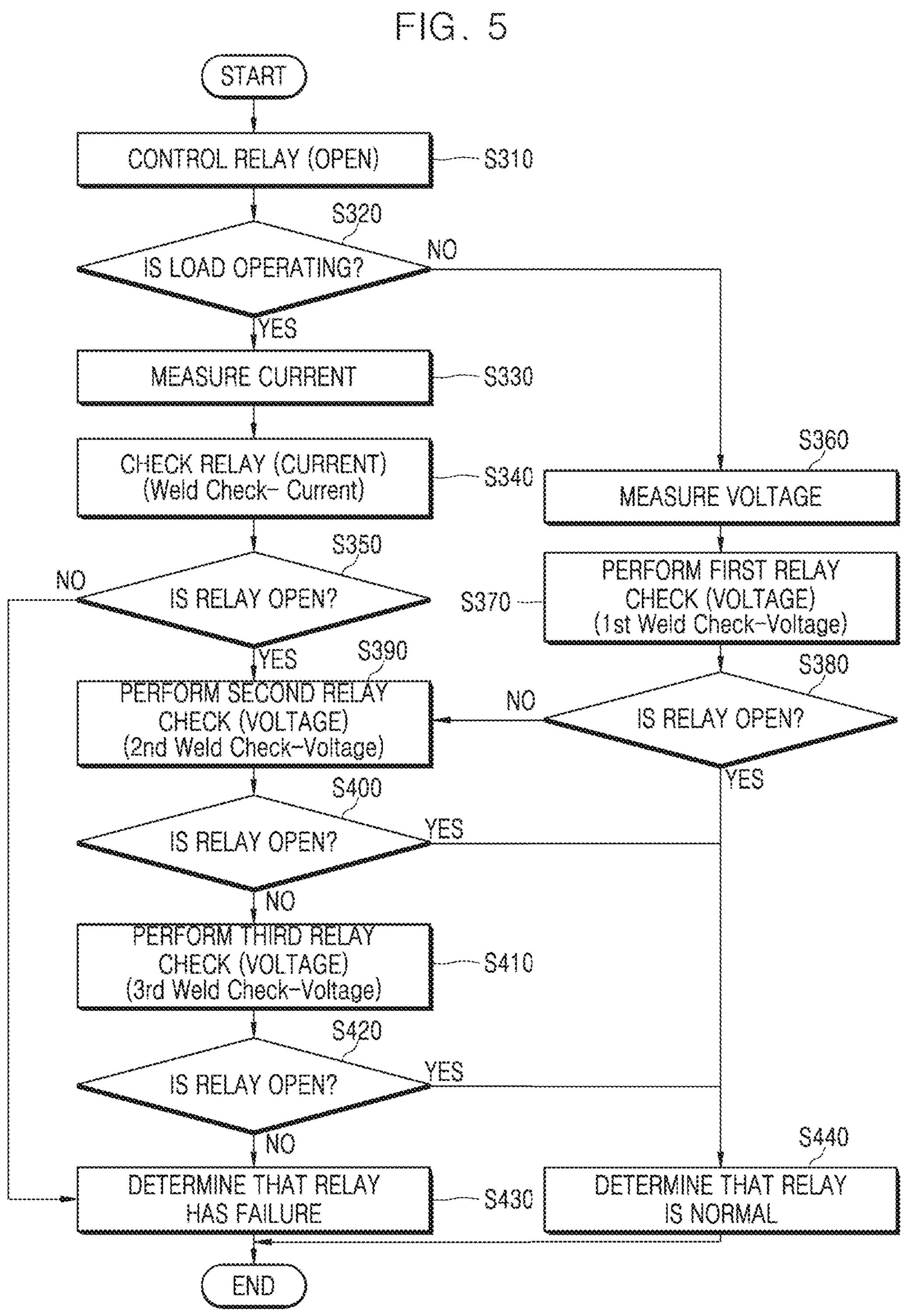
FIG. 5 is a flowchart of a method of checking a relay of a battery pack control apparatus according to some embodiments of the present invention.

FIG. 5 is a flowchart of a method of checking a relay of a battery pack control apparatus according to some embodiments of the present invention.

Referring to FIG. 5, the processor 210 transmits a control signal to open the relay 250 based on a state of the battery module 290 or data received through the communication unit 230 (S310).

The processor 210 checks a state of the relay 250 using a voltage or current measurement according to a state of a load connected to the battery pack (S320).

When the load connected to the battery pack stops operating, the processor 210 measures a current through the current sensor 242 (S330).

The processor 210 checks a state of the relay 250 on the basis of the measured current (also referred to as weld check, S340).

When a current is checked as zero, the processor 210 may determine that the relay 250 is opened, and when a current is non-zero, the relay 250 is in the closed state and the processor 210 may determine that the relay 250 malfunctions (S350).

When the processor 210 determines that the relay 250 is in the closed state as a result of checking based on the current, the processor 210 immediately determines that the relay 250 has a failure (S430). When the current is non-zero, the processor 210 may immediately determine that the relay 250 has a failure because all of the plurality of relays 250 malfunction.

When it is determined that the relay 250 is in an open state according to the measured current, the processor 210 may recheck a state of the relay 250 using a voltage.

The processor 210 measures voltages at both ends of the relay 250 through the voltage sensor 241 to perform a second relay check (a weld check, S390).

The processor 210 measures a voltage while a load connected to the battery pack operates (S360).

For example, in a state in which the battery pack is mounted in a hybrid vehicle, when a battery output stop request is received while the vehicle engine is driven, the processor 210 may control the relay 250 to be opened (e.g., may transmit a control signal to open the relay 250), but because the vehicle is operating, a state of the relay 250 may be checked using the voltage.

The processor 210 measures voltages at both ends of the relay 250 through the voltage sensor 241 to perform a first relay check on the basis of the voltages (also referred to as 1$^{st}$ Weld Check-Voltage, S370).

The processor 210 determines whether the relay 250 is in the open state (S380).

When voltages at both ends of the relay 250 are the same or substantially the same, the processor 210 may determine that the relay 250 is in the closed state, and when voltages at both ends are different (e.g., are off by more than 5%), the processor 210 may determine that the relay 250 is opened.

When all the plurality of relays 250 are in the open state, the processor 210 may finally determine that the relay 250 operates normally (S440).

When at least one relay 250 is in the closed state, the processor 210 performs the second relay check (S390).

The processor 210 measures voltages at both ends of the relay 250 to perform the second relay check and redetermines whether the relay 250 is in the open state (S400).

When the relay 250 is in the open state, the processor 210 may finally determine that the relay 250 operates normally (S440).

When the relay 250 is not in the open state, the processor 210 may measure a voltage (e.g., a relay voltage) to perform a third relay check (S410). The processor 210 finally determines a state of the relay 250 through the third relay check.

The processor 210 determines whether the relay 250 is in the open state (S420), and when the relay 250 is in the open state, the processor 210 finally determines that the relay 250 is normal (S440), and when the relay 250 is in a closed state, the processor 210 finally determines that the relay 250 has a failure (S430).

When it is finally determined that the relay 250 has the failure, the processor 210 transmits an error signal for the failure of the relay 250 to a connected device through the communication unit 130, and determines that the battery pack is unusable.

Figure 6:
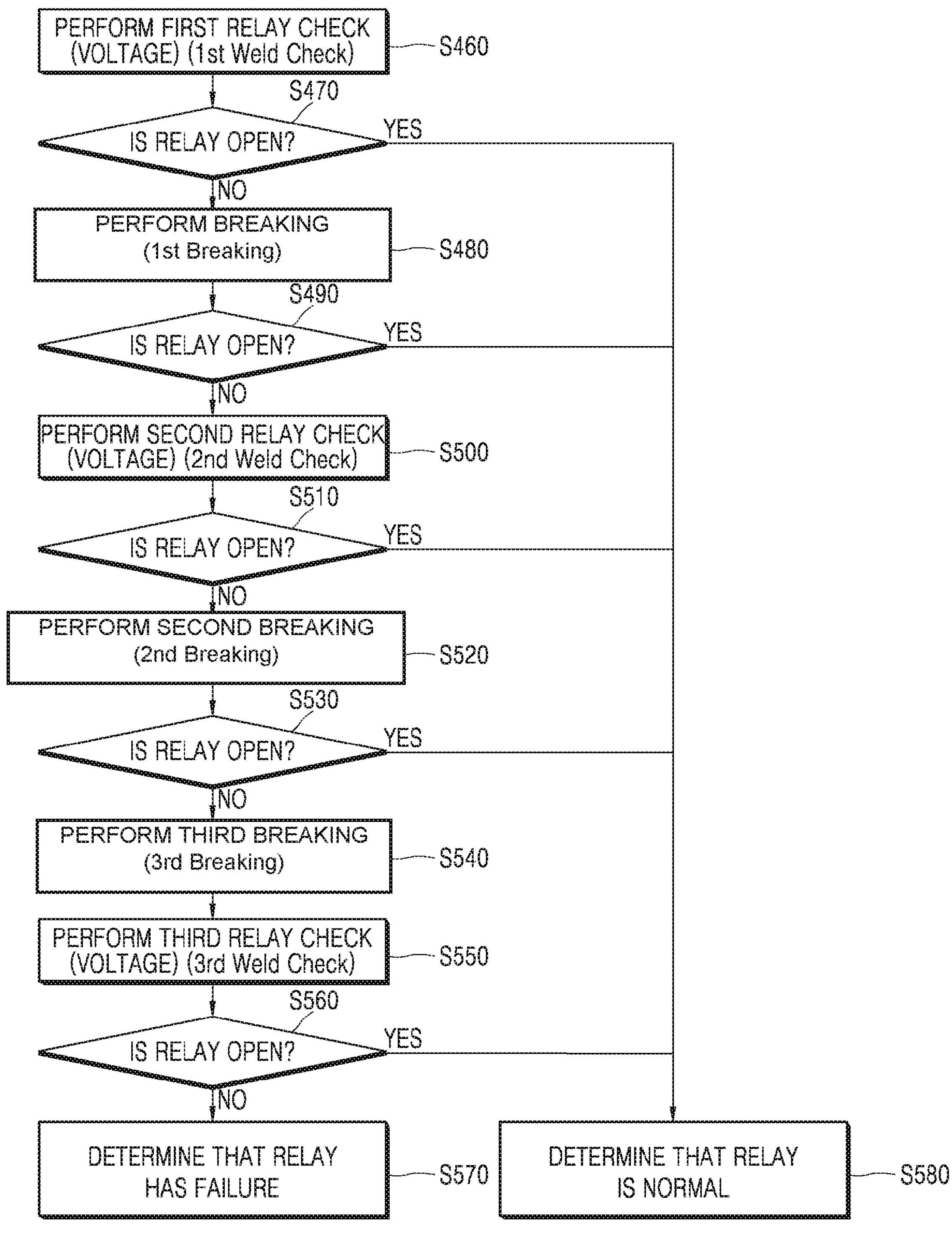
FIG. 6 is a flowchart of a method of fixing a relay of a battery pack control apparatus according to some embodiments of the present invention.

FIG. 6 is a flowchart of a method of fixing a relay of a battery pack control apparatus according to some embodiments of the present invention.

Referring to FIG. 6, the processor 210 controls the relay 250 to be opened (e.g., transmits a control signal to open the relay 250) and then checks a state of the relay 250 using a voltage.

In this case, the processor 210 checks the relay 250 using the voltage, and when the relay 250 is not in an open state, the processor 210 performs fixing on the relay 250.

The processor 210 may fix the relay 250 by repeatedly switching on and off an operating voltage of the relay 250 a predetermined number of times.

The processor 210 performs a first relay check (voltage) (S460) and determines whether the relay 250 is in the open state (S470).

When the relay 250 is not in the open state, the processor 210 performs a first relay fixing through breaking (S480).

The processor 210 may fix the relay 250 by repeatedly turning the operating voltage applied to the relay 250 on and off a predetermined number of times (a process that is also referred to as breaking). The relay 250 may be repeatedly turned on and off according to the operating voltage.

The processor 210 may fix the relay and determine whether the relay 250 is in the open state in response to the voltages at both ends of the relay 250 (S490).

When the relay 250 is in the open state, the processor 210 determines that the relay 250 is normal (S580), and when the relay 250 in the closed state is maintained in that state, the processor 210 performs a second relay check (S500).

The processor 210 performs the second relay check and again determines whether the relay 250 is in the open state (S510).

When the relay 250 is in the open state, the processor 210 determines that the relay 250 operates normally (S580), and when the relay 250 in the closed state is maintained, the processor 210 performs a second relay fixing through breaking (S520).

The processor 210 performs the second relay fixing and determines whether the relay 250 is in the open state (S530).

When the relay 250 is in the open state, the processor 210 determines that the relay 250 is normal (S580), and when the relay 250 in the close state is maintained in that state, the processor 210 performs a third relay fixing through breaking (S540). Because the third relay check is to finally check (e.g., perform a final check of) the state of the relay 250, the third relay fixing may be performed through breaking before the third relay check is performed.

In this case, before the second relay fixing is performed, the processor 210 may be shut down and then woken up (e.g., restarted).

After performing the third relay fixing, the processor 210 performs the third relay check (S550).

After performing the third relay check, the processor 210 determines whether the relay 250 is in the open state (S560).

When the relay 250 is in the open state, the processor 210 determines that the relay 250 operates normally (S580), and when the relay in the closed state is maintained in that state, the processor 210 finally determines that the relay 250 has a failure (S570).

Figure 7:
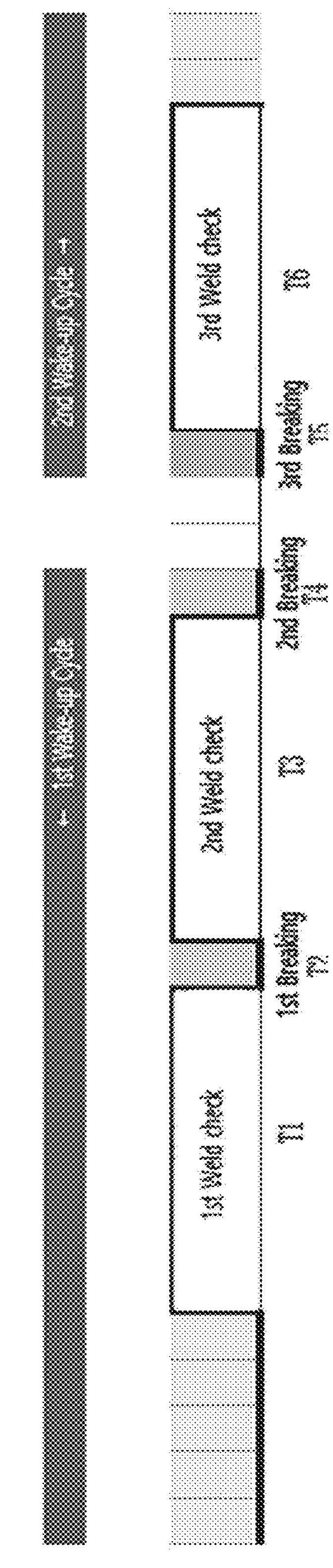
FIG. 7 shows a signal flow for checking a relay of the battery pack control apparatus according to some embodiments of the present invention.

FIG. 7 shows a signal flow for checking a relay of the battery pack control apparatus according to some embodiments of the present invention.

Referring to FIG. 7, the processor 210 receives a signal from a vehicle or apparatus in which the battery pack is installed to control the relay 250 to be opened (e.g., to transmit a control signal to open the relay 250).

The processor 210 checks whether the relay 250 is in an open state.

The processor 210 receives voltages at both ends of the relay 250 through the voltage sensor 241, performs the first relay check, and determines a state of the relay 250.

The processor 210 may perform the first relay check during a first period T1.

The processor 210 performs the first relay fixing (i.e., breaking) during a second period T2 depending on whether the relay 250 is open.

In addition, the processor 210 may perform the second relay check during a third period T3 and may perform the second relay fixing during a fourth period T4.

Before performing the third relay check, the processor 210 may be shut down and woken up (e.g., restarted).

Before the processor 210 finally determines a state of the relay 250, the processor 210 may perform third relay fixing during a fifth period T5, and then may perform the third relay check during a sixth period T6.

The first period T1, the third period T3, and the fifth period T5 may be set to be different (e.g., to be off by more than 5%). Although the first period T1 and the third period T3 may be the same or substantially the same, the sixth period T6 may be set to be longer than each of the first period T1 and the third period T3.

The second period T2 and the fourth period T4 may be set to be the same or substantially the same. The fifth period T5 may be set to be longer than each of the second period T2 and the fourth period T4.

When the relay 250 temporarily malfunctions, the processor 210 repeatedly performs relay check and relay fixing to control the relay 250 to operate normally.

The processor 210 may perform the relay check and the relay fixing to finally determine a state of the relay 250. When a state of the relay 250 is determined to be an open state during the first or second relay check or relay fixing operations, the processor 210 may determine that the relay 250 is normal and stop the relay check and fixing.

Figures 8A, 8B:
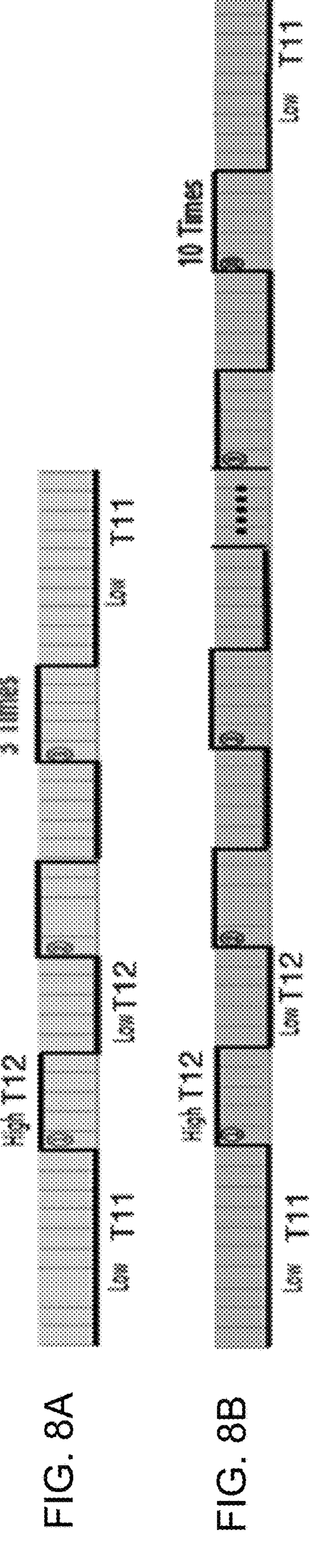
FIGS. 8A and 8B show signal flows for fixing a relay of the battery pack control apparatus according to some embodiments of the present invention.

FIGS. 8A-8B show signal flows for fixing a relay of the battery pack control apparatus according to some embodiments of the present invention.

Referring to FIG. 8A, the processor 210 may perform first relay fixing for a second period T2 and second relay fixing for a fourth period T4.

When the processor 210 performs the first relay fixing and the second relay fixing, the processor 210 turns the relay 250 off (e.g., opens the relay 250) for a seventh period T11.

The processor 210 controls the relay 250 to be turned on for an eighth period T12, and then controls the relay 250 to be turned off for the eighth period T12. The processor 210 repeatedly turns on and off an operating voltage of the relay 250 for the eighth period T12 a number of times (e.g., a predetermined number of times). For example, the processor 210 may repeatedly turn on and off the operating voltage of the relay 250 three to five times.

When the processor 210 finally turns the relay 250 off, the processor 210 controls the relay 250 to be turned off for the seventh period T11.

Then, the processor 210 measures voltages at both ends of the relay 250 to determine whether the relay 250 is in an open state.

Referring to FIG. 8B, when third relay fixing is performed, the processor 210 turns the relay 250 off for the seventh period T11.

The processor 210 controls the relay 250 to be turned on for the eighth period T12, and controls the relay 250 to be turned off for the eighth period T12. The processor 210 repeatedly turns on and off the operating voltage of the relay 250 for the eighth period T12 a number of times (e.g., a predetermined number of times). For example, the processor 210 may turn on and off the operating voltage of the relay 250 (e.g., repeatedly close and open the relay 250) eight to ten times.

The processor 210 may control the relay 250 for the fifth period T5, which is longer than a period of each of the first relay fixing and the second relay fixing.

When the processor 210 finally turns the relay 250 off, the processor 210 controls the relay 250 to be turned off during the seventh period T11.

Then, the processor 210 measures voltages at both ends of the relay 250 to finally determine whether the relay is in the open state.

Accordingly, even when the relay 250 temporarily malfunctions, the processor 210 may not immediately determine that the relay 250 has a failure and may perform relay check and relay fixing a number of times (e.g., a predetermined number of times) to fix the relay 250 so that the relay 250 operates normally.

Accordingly, the battery pack control apparatus and method according some embodiments of the present invention can fix a temporary failure of the relay and increase a lifetime of the battery pack.

As described above, although some embodiments of the present invention has been described with reference to limited specific embodiments and drawings, the present invention is not limited thereto, and various suitable modifications and changes may be made by those skilled in the art in the technical spirit of the present invention, which is defined by the following claims and equivalents thereof.

The present invention described in this specification can be implemented through, for example, a method, a process, an apparatus, a software program, a data stream, or a signal. Even when the present invention is described as being implemented in only a single form (e.g., as the method), the described features may be implemented in another form (e.g., as the apparatus or program). The apparatus may be implemented using proper hardware, software, firmware, or the like. For example, the method may be implemented in an apparatus such as a processor which generally refers to a processing device such as a computer, a microprocessor, an integrated circuit, and a programmable logic device. The processor includes a communication device such as a computer, a cell phone, a portable/personal digital assistant (PDA) terminal, and other devices which facilitate information communication between final users.

In this case, the processor may be implemented as a CPU or system on chip (SoC), may drive an operating system or application to control a plurality of hardware or software components connected to the processor, and may perform various data processing and operation. The processor may be configured to execute at least one command stored in the memory and store result data of the execution in the memory.

According to some embodiments of the present invention, even when a failure of a relay is detected, the failure can be accurately diagnosed by checking and fixing the failure of the relay so that a problem due to a temporary malfunction is eliminated (e.g., removed).

According to some embodiments of the present invention, a temporary malfunction of a relay can be easily fixed by repeatedly turning on and off an operating voltage of the relay.

According to some embodiments of the present invention, accuracy of diagnosis for a relay can be improved by repeatedly determining a state of the relay based on a relay current or voltage.

According to the present invention, a lifetime of a battery pack can be increased by solving a problem that a battery pack cannot be used due to a temporary failure.

What is claimed is:

1. A battery pack control apparatus for fixing a failure of a relay, the battery pack control apparatus comprising:

- a battery module comprising a plurality of battery cells;
- the relay that is configured to selectively conduct or block an output current of the battery module;
- a current sensor configured to detect the output current of the battery module;
- a voltage sensor configured to measure voltages at both ends of the relay; and
- a processor configured to control the relay and to detect a state of the relay based on at least one of the output current detected by the current sensor or the voltages measured by the voltage sensor, and in response to determining that the relay malfunctions, to check and fix the relay,
- wherein the processor is configured to check the state of the relay based on the voltages in response to a vehicle being in an operational state, and to check the state of the relay based on the output current in response to the vehicle being in a stopped state.

2. The battery pack control apparatus of claim 1, wherein, in response to detecting that the relay is in a closed state, the processor is configured to determine that the relay malfunctions and to perform checking and fixing of the relay a number of times.

3. The battery pack control apparatus of claim 1, wherein the processor is configured to determine whether the relay is in an open state based on any one of the output current and the voltages.

4. The battery pack control apparatus of claim 1, wherein the processor is configured to check a state of the relay based on the output current, and in response to determining that the relay is in an open state, the processor is configured to recheck a state of the relay based on the voltages.

5. The battery pack control apparatus of claim 1, wherein the processor is configured to determine a state of the relay based on the output current, and in response to determining that the relay is in a closed state, the processor is configured to determine that the relay has the failure.

6. The battery pack control apparatus of claim 1, wherein the processor is configured to check a state of the relay based on the voltages, and in response to determining that the relay is in an open state, the processor is configured to determine that the relay operates normally.

7. The battery pack control apparatus of claim 1, wherein the processor is configured to check a state of the relay based on the voltages, and in response to determining that the relay is not in an open state, the processor is configured to fix the relay.

8. The battery pack control apparatus of claim 7, wherein the processor is configured to fix the relay by repeatedly turning on and off an operating voltage of the relay a number of times.

9. The battery pack control apparatus of claim 1, wherein the processor is configured to fix the relay first in response to determining that the relay is in a closed state, and to finally check the relay.

10. The battery pack control apparatus of claim 9, wherein the processor is configured to finally check the relay, and in response to determining that the relay is in a closed state, the processor is configured to finally determine that the relay has a permanent failure.

11. A battery pack control method for fixing a failure of a relay, the method comprising:

- controlling, by a processor, a relay configured to be opened in response to a state or request signal of a battery module;
- detecting, by the processor, a state of the relay based on at least one of a current and a voltage;
- checking and fixing, by the processor, the relay in response to determining that the relay malfunctions;
- stopping, by the processor, the checking and fixing in response to determining that the relay operates normally while the checking and fixing of the relay are performed; and
- determining, by the processor, that the relay has a permanent failure in response to determining that the relay has a failure,
- wherein the checking and fixing of the relay comprises:
  - rechecking a state of the relay in response to the voltages in response to determining that the relay is normal based on the current; and
  - fixing the relay according to a rechecking result.

12. The method of claim 11, wherein the detecting of the state of the relay comprises:

- detecting, by a current sensor, an output current of the battery module while a vehicle operates;
- determining that the relay malfunctions in response to the relay being in a closed state according to the output current;
- determining that the relay operates normally in response to the relay being in an open state according to the output current; and
- determining that the relay has the failure in response to the relay malfunctioning.

13. The method of claim 12, wherein the detecting of the state of the relay comprises:

- determining, by the processor, that the relay is in the closed state in response to the output current being non-zero; and
- determining, by the processor, that the relay is in an open state in response to the output current being zero.

14. The method of claim 11, wherein the detecting of the state of the relay comprises:

- measuring, by a voltage sensor, voltages at both ends of the relay in response to a vehicle being stopped;
- comparing the voltages at both ends of the relay;
- determining that the relay malfunctions in response to the relay being in a closed state according to the voltages at both ends of the relay; and
- determining that the relay operates normally in response to the relay being in an open state according to the voltages at both ends of the relay.

15. The method of claim 14, wherein the detecting of the state of the relay comprises:

determining, by the processor, that the relay is in the closed state in response to the voltages at both ends of the relay being the same; and determining, by the processor, that the relay is in the open state in response to the voltages at both ends of the relay being different.

16. The method of claim 11, wherein the checking and fixing of the relay comprises:

checking the state of the relay in response to the voltages; and fixing the relay according to a checking result.

17. The method of claim 11, wherein the checking and fixing of the relay comprises fixing, by the processor, the relay by repeatedly turning on and off an operating voltage of the relay a number of times.

18. The method of claim 11, wherein the checking and fixing of the relay further comprises:

checking and fixing the relay a number of times;

fixing the relay first when it is determined that the relay is in a closed state; and checking the relay.

* * * * *